(12) United States Patent
Chen

(10) Patent No.: US 6,707,739 B2
(45) Date of Patent: Mar. 16, 2004

(54) TWO-PHASE PRE-CHARGE CIRCUIT AND STANDBY CURRENT ERASURE CIRCUIT THEREOF

(75) Inventor: Chieng Chung Chen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/222,507

(22) Filed: Aug. 16, 2002

(65) Prior Publication Data

US 2003/0189852 A1 Oct. 9, 2003

(30) Foreign Application Priority Data

Apr. 9, 2002 (TW) ........................................ 91107145 A

(51) Int. Cl.[7] ................................................. G11C 7/00
(52) U.S. Cl. ........................ 365/203; 365/202; 365/227
(58) Field of Search ................................ 365/203, 227, 365/190, 202, 205, 218, 226

(56) References Cited

U.S. PATENT DOCUMENTS

| 5,343,038 | A | * | 8/1994 | Nishiwaki et al. | .......... 250/234 |
| 5,499,211 | A | | 3/1996 | Kirihata et al. | ............. 365/203 |
| 5,872,737 | A | * | 2/1999 | Tsuruda et al. | ........ 365/189.05 |
| 6,144,599 | A | * | 11/2000 | Akita et al. | ................. 365/203 |

* cited by examiner

Primary Examiner—Gene Auduong
(74) Attorney, Agent, or Firm—Ladas & Parry

(57) ABSTRACT

The present invention discloses a two-phase pre-charge circuit and a standby current erasure circuit thereof which is only activated during the active mode for electrically connecting the source of pre-charge voltage and the complementary bit lines. In the standby mode, the two-phase pre-charge circuit is in a disablement state, thereby the short DC standby current between the complementary bit lines and word lines is erased.

6 Claims, 3 Drawing Sheets

TWO-PHASE PRE-CHARGE CIRCUIT AND STANDBY CURRENT ERASURE CIRCUIT THEREOF

BACKGROUND OF THE INVENTION

1. Field of the Invention

The present invention relates to a standby current erasure circuit applied in DRAM, more particularly to a circuit for erasing the short DC standby current between the complementary bit lines and the word lines of DRAM.

2. Background of the Invention

In the manufacturing process of DRAM, a short circuit between the bit line and the word line sometimes occurs and causes a leakage current and affects the product yield.

One of the solutions for the above-mentioned problem is disclosed in U.S. Pat. No. 5,499,211, entitled "BIT-LINE PRE-CHARGE CURRENT LIMITER FOR CMOS DYNAMIC MEMORIES." As shown in FIG. 1, a conventional circuit 10 comprises a word line 12, a pair of complementary bit lines 13, a pre-charge equalizing circuit 14 and a current-limiting means 11. In prior art, in order to prevent an excess leakage current caused by the short circuit between the bit line (WL) and the word line (BL), a current-limiting means 11, such as a depletion NMOS, is added between a source of pre-charge voltage (VBLEQ) 15 and the pair of complementary bit lines 13 so as to limit the maximum leakage current when the short circuit between the bit line and the word line occurs.

Generally, the word line voltage ($V_{WL}$) is 0 volt in the standby mode, but the bit line voltage is larger than 0 volt. Thus, a leakage current path will be formed in the standby mode. The leakage current will flow from BLEQ, BL, WL to the ground. In other words, the conventional method cannot effectively reduce the leakage current when the short circuit between the bit line and the word line occurs. For the current application in the product for low power DRAM, the leakage current is still too large to satisfy the market requirement.

Regarding the problems in the prior art, the present invention provides an innovative standby current erasure circuit for the DRAM to overcome the above-mentioned disadvantages.

SUMMARY OF THE INVENTION

The object of the present invention is to provide a two-phase pre-charge circuit and its short DC standby current erasure circuit of DRAM, which is suitable for the application requirement in a low power DRAM.

To this end, the present invention discloses a two-phase pre-charge circuit which is only activated during the active mode of the DRAM for electrically connecting the source of pre-charge voltage and the complementary bit lines. In the standby mode of the DRAM, the two-phase pre-charge circuit is in a disablement state, thereby the short DC standby current between the complementary bit lines and word lines is erased.

The standby current erasure circuit for DRAM according to the present invention comprises a pre-charge equalization circuit and at least one control signal. One end of the pre-charge equalization circuit is connected to the source of pre-charge voltage and the other end is connected to the complementary bit line. The at least one control signal is used to generate one pulse in the beginning and end of the active mode of the DRAM for electrically connecting the source of pre-charge voltage and the complementary bit line, and the at least one control signal is disabled in the standby mode of the DRAM.

BRIEF DESCRIPTION OF THE DRAWINGS

The present invention will be described according to the appended drawings in which.

PREFERRED EMBODIMENT OF THE PRESENT INVENTION

Figure 1A:
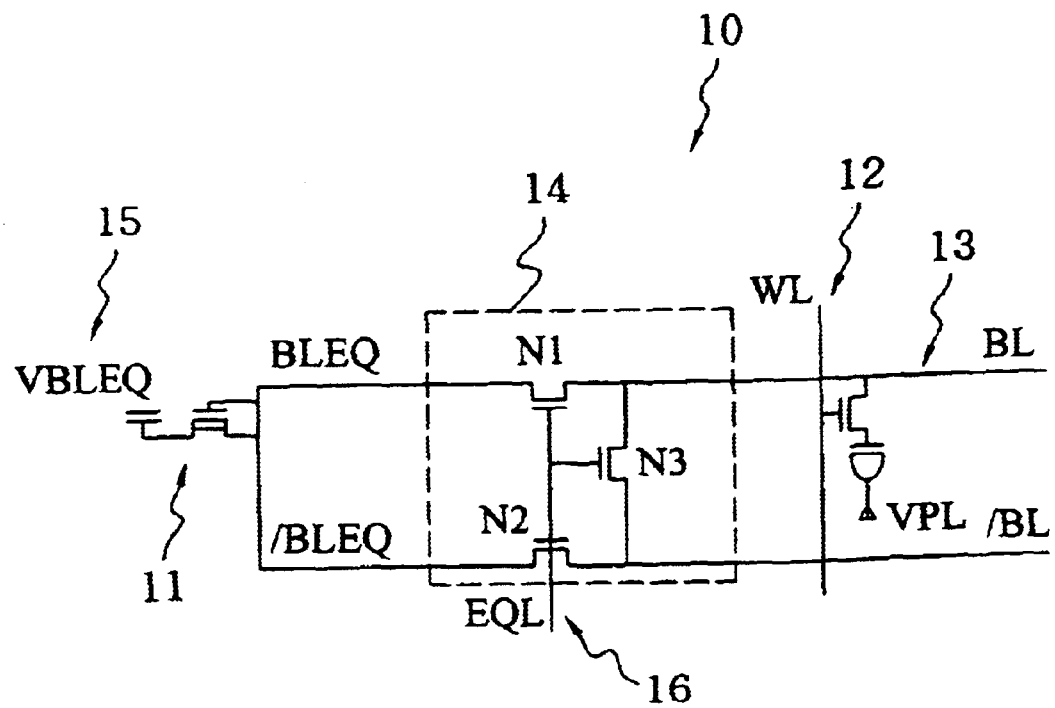
FIG. 1(a) shows a prior art standby current erasure circuit.
Figure 1B:
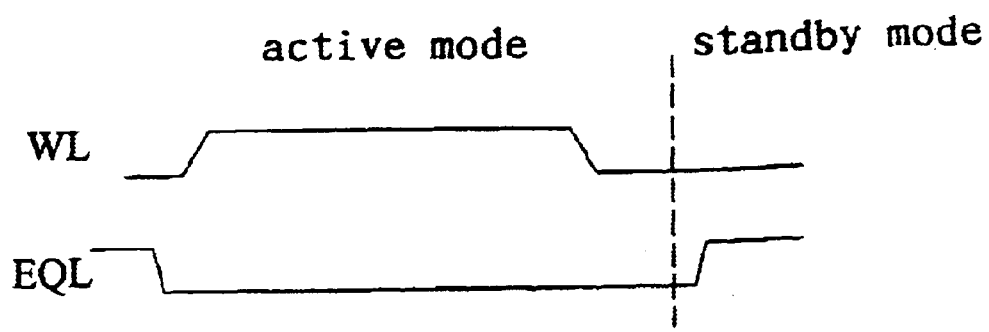
FIG. 1(b) shows a timing diagram of FIG. 1(a)
Figure 2A:
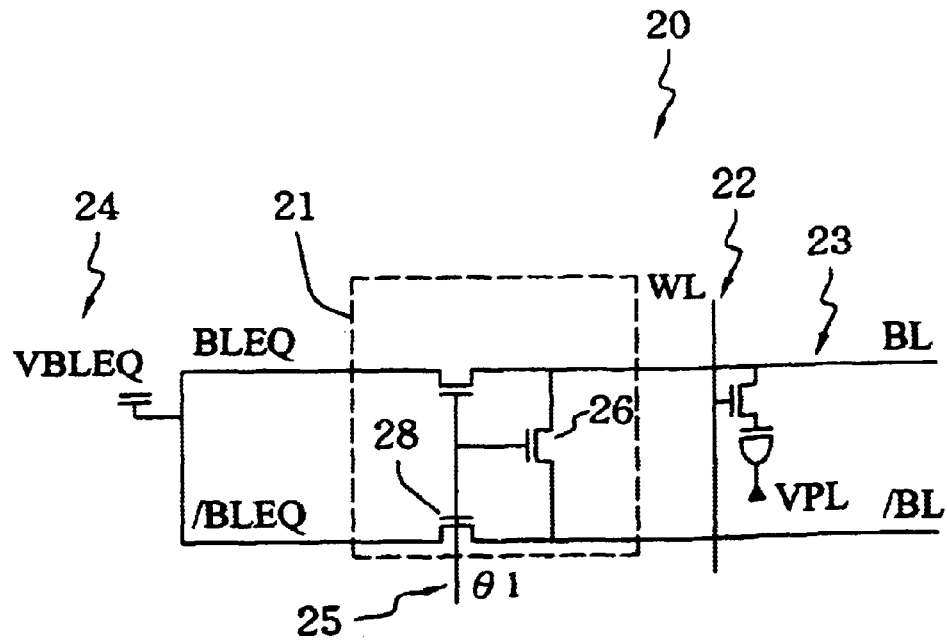
FIG. 2(a) shows the standby current erasure circuit according to a first embodiment of the present invention.
Figure 2B:
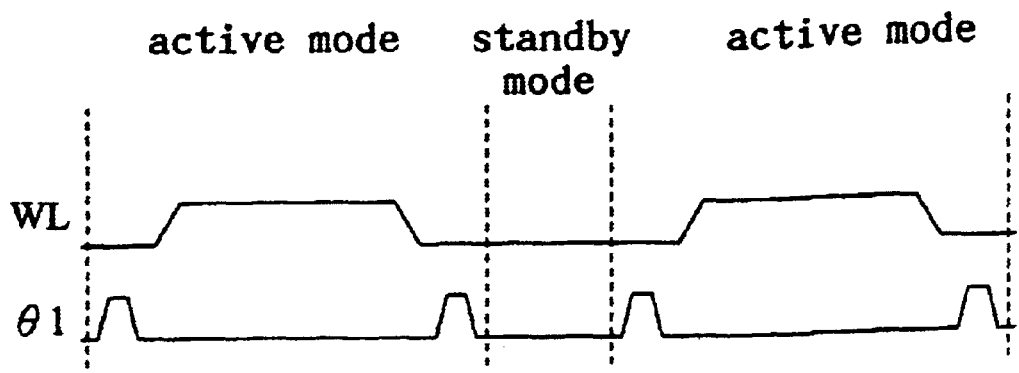
FIG. 2(b) shows a timing diagram of FIG. 2(a)

Please refer to FIG. 2(a), the standby current erasure circuit 20 for DRAM according to the present invention comprises a source of pre-charge voltage 24, a plurality of word lines 22, a plurality of complementary bit lines 23 and a plurality of pre-charge equalization circuits 21. In this embodiment, $\theta_1$ control signals 25 with two phases are adopted in the pre-charge equalization circuits 21. In an active mode, the $\theta_1$ control signals 25 will generate two pulses. One of the two pulses is generated before the word line is enabled, and the other is generated after the word line is enabled for pre-charging the complementary bit lines 23 into a level of pre-charge voltage VBLEQ 24. The most important issue is that the $\theta_1$ control signals 25 are disabled in a standby mode, so even the bit lines 23 and word lines 22 are short, the DC standby current will not occur. By the circuit of the present invention, the short DC standby current in the standby mode due to a manufacturing flaw will be erased and thereby the specification requirements of low power DRAM products will be satisfied.

In addition, as the conducting path of bit lines 23 in the standby mode is disabled, the short DC standby current between the bit lines 23 and word lines 22 is completely erased. In other words, the present invention can omit the current limiting means 11 in prior art, but still obtains a better performance.

Figure 3A:
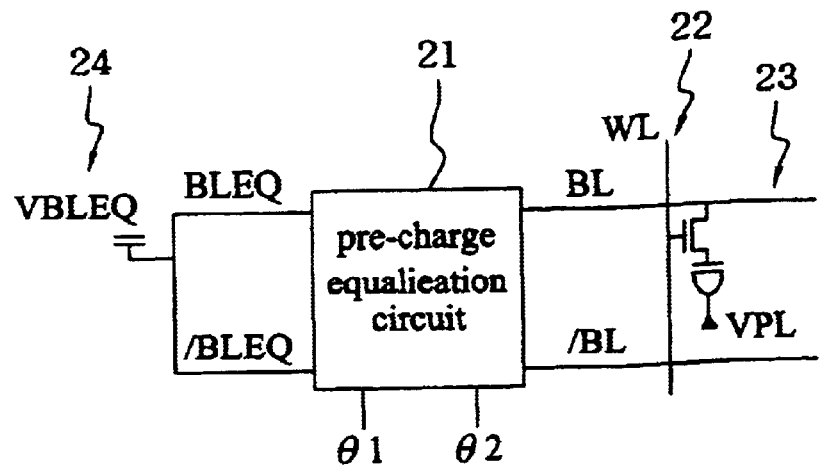
FIG. 3(a) shows the standby current erasure circuit according to a second embodiment of the present invention.
Figure 3B:
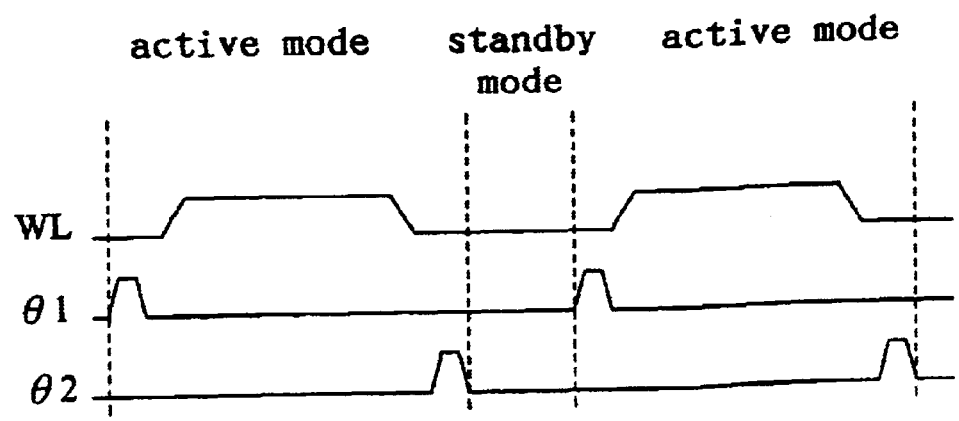
FIG. 3(b) shows a timing diagram of FIG. 3(a).

Please refer to FIG. 3(a); two control signals $\theta_1$ and $\theta_2$ are adopted in the pre-charge equalization circuits 21 in this embodiment. The $\theta_1$ control signal is used to generate a pulse before the word lines are enabled during the active mode, and the $\theta_2$ control signal is used to generate a pulse after the word lines are enabled during the active mode. The same as the first embodiment, even if the control signals are $\theta_1$ or $\theta_2$, they are both in a disablement state so as to ensure no short DC standby current occurs between the bit lines 23 and word lines 22.

The pre-charge circuit 21 of the present invention is not limited to a is specific structure. In FIG. 2(a), the structure comprises a first transistor 26, a second transistor 27 and a third transistor 28. The first transistor 26 is connected to the plurality of complementary bit lines 23 in parallel, the second and the third transistors 27 and 28 are connected to the plurality of complementary bit lines 23 in series, respectively, and the gates of the first, second and third transistors 26, 27 and 28 are connected to the control signals 25. However, the structure of FIG. 2(a) is just an embodiment that whatever can pre-charge the source of the pre-charge voltage VBLEQ 24 to the voltage level of the complementary bit lines 23 are in the scope of the present invention.

The above-described embodiments of the present invention are intended to be illustrative only. Numerous alternative embodiments may be devised by those skilled in the art without departing from the scope of the following claims.

What is claimed is:

1. A two-phase pre-charge circuit for erasing a short DC standby current between a word line and a pair of complementary bit lines of DRAM, comprising:

a pre-charge equalization circuit, one end of said pre-charge equalization circuit connected to a source of pre-charge voltage and another end connected to said complementary bit lines; and at least one control signal for generating one pulse in the beginning and another pulse at the end of an active mode of said DRAM for electrically connecting said source of pre-charge voltage and said complementary bit lines, said at least one control signal being disabled in a standby mode of said DRAM.

2. The two-phase pre-charge circuit of claim 1, wherein said pre-charge equalization circuit comprises a first, second and third transistors, said first transistor is connected to said complementary bit lines in parallel, said second and third transistors are connected to said complementary bit lines in series, and gates of said first, second and third transistors are connected to said at least one control signal.

3. The two-phase pre-charge circuit of claim 1, wherein said control signals are divided into two groups, one group is used to generate a pulse in the beginning of said active mode and the other group is used to generate a pulse in the end of said active mode.

4. A short DC standby current erasure circuit of DRAM, comprises a source of pre-charge voltage, a plurality of word lines, a plurality of complementary bit lines and a plurality of pre-charge equalization circuits, characterized in that control signals of the plurality of pre-charge equalization circuits generate respective pulses only in the beginning and at the end of an active mode of said DRAM for electrically connecting said source of pre-charge voltage and said complementary bit lines, said control signals are disabled in a standby mode of said DRAM, thereby the short DC standby current between the complementary bit lines and word lines is erased.

5. The short DC standby current erasure circuit of claim 4, wherein said control signals of said pre-charge equalization circuit are divided into two groups, one group is used to generate a pulse in the beginning of said active mode and the other group is used to generate a pulse in the end of said active mode.

6. The short DC standby current erasure circuit of claim 4, wherein to each of the plurality of pre-charge equalization circuits comprises a first, second and third transistor, said first transistor is connected to said complementary bit lines in parallel, said second and third transistors are connected to said complementary bit lines in series, and gates of said first, second and third transistors are connected to said control signals.

* * * * *